(12) United States Patent
Nickel

(10) Patent No.: US 10,830,854 B2
(45) Date of Patent: Nov. 10, 2020

(54) METHOD, COMPUTER AND IMAGING APPARATUS

(71) Applicant: Siemens Healthcare GmbH, Erlangen (DE)

(72) Inventor: Marcel Dominik Nickel, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 134 days.

(21) Appl. No.: 16/257,417

(22) Filed: Jan. 25, 2019

(65) Prior Publication Data

US 2019/0235040 A1 Aug. 1, 2019

(30) Foreign Application Priority Data

Jan. 29, 2018 (DE) ........................ 10 2018 201 314

(51) Int. Cl.
| | |
|---|---|
| *G01R 33/565* | (2006.01) |
| *G06T 5/00* | (2006.01) |
| *G01R 33/56* | (2006.01) |
| *G06T 3/40* | (2006.01) |
| *G06T 5/50* | (2006.01) |
| *G01R 33/48* | (2006.01) |

(Continued)

(52) U.S. Cl.
CPC ....... *G01R 33/565* (2013.01); *G01R 33/5605* (2013.01); *G01R 33/5608* (2013.01); *G06T 3/40* (2013.01); *G06T 5/002* (2013.01); *G06T 5/50* (2013.01); *G01R 33/246* (2013.01); *G01R 33/4828* (2013.01); *G01R 33/50* (2013.01); *G06T 2207/10096* (2013.01)

(58) Field of Classification Search
CPC .................................................. G01R 33/565
USPC ....................................................... 382/254
See application file for complete search history.

(56) References Cited

U.S. PATENT DOCUMENTS

| | | | |
|---|---|---|---|
| 6,263,228 B1 | 7/2001 | Zhang et al. | |
| 8,073,345 B2 * | 12/2011 | Chen .................. | H04B 10/6165 398/205 |

(Continued)

OTHER PUBLICATIONS

German Action dated Apr. 28, 2020, Application No. 10 2018 201 314.4.

(Continued)

*Primary Examiner* — Jerome Grant, II
(74) *Attorney, Agent, or Firm* — Schiff Hardin LLP

(57) ABSTRACT

In a method, computer and magnetic resonance (MR) apparatus for normalizing MR contrast images of an examination object that has two chemically different substances (SW, SF), wherein the first substance produces a first image signal and the second substance produces a second image signal, a processor is provided with a complex-valued contrast having pixels with signal contributions from the first and second substances. A phase correction of this contrast image is performed by calculating a real-valued contrast from the amount of the image signals of each pixel of the complex-valued contrast image. A mathematically smooth correction map is determined based on a number of the pixels that have a defined real-valued contrast. The intensity of pixels of the complex-valued contrast image are homogenized with other scans based on the correction map.

15 Claims, 3 Drawing Sheets

(51) Int. Cl.
  *G01R 33/50*  (2006.01)
  *G01R 33/24*  (2006.01)

(56) References Cited

U.S. PATENT DOCUMENTS

| | | | | |
|---|---|---|---|---|
| 8,891,846 | B2* | 11/2014 | Fautz | G01R 33/5659 |
| | | | | 382/131 |
| 2010/0239149 | A1* | 9/2010 | Wang | G01R 33/4828 |
| | | | | 382/131 |
| 2011/0091090 | A1 | 4/2011 | Dahlqvist Leinhard et al. | |
| 2011/0234221 | A1* | 9/2011 | Feiweier | G01R 33/56518 |
| | | | | 324/307 |
| 2013/0324864 | A1* | 12/2013 | Manstrom | A61B 5/0022 |
| | | | | 600/486 |
| 2017/0124706 | A1* | 5/2017 | Shiodera | G06T 5/50 |
| 2019/0113588 | A1* | 4/2019 | Tamura | G01R 33/5673 |
| 2019/0383889 | A1* | 12/2019 | Wang | G01R 33/5611 |

OTHER PUBLICATIONS

Sung, et al.: "Simultaneous T1 and B1+ Mapping Using Reference Region Variable Flip Angle Imaging" Magnetic Resonance in Medicine, vol. 70, No. 4, pp. 954âe961, (2013).
Ma, "Silicone-specific imaging using a single-echo Dixon technique" International Society for Magnetic Resonance in Medicine (ISMRM), vol. 16, p. 2723, (2008).

\* cited by examiner

METHOD, COMPUTER AND IMAGING APPARATUS

BACKGROUND OF THE INVENTION

Field of the Invention

The invention concerns a method for normalizing magnetic resonance images, in particular relative to B1+ and/or T1, based on phase-corrected out-of-phase acquisitions. The invention also concerns a corresponding computer, a non-transitory data storage medium, and a magnetic resonance imaging apparatus that implement such a method.

Description of the Prior Art

With magnetic-resonance recordings, a magnetic resonance imaging (MRI) system is used to generate image data of the interior of an examination object, such as a patient.

The images that recorded by operation of a magnetic resonance imaging system (called "MR images") have no absolute unit, and so at present satisfactory normalization of the images is problematic. This is linked to the unknown characteristics of the transmitted radio-frequency (RF) profile, the "B1+ field", that is emitted to excite certain nuclear spins in a subject, and the received RF profile, called the "B1− field" of the MR signals (which are RF signals) that result as the excited nuclear spins relax.

Current image processing methods, such as homomorphic filtering, attempt to homogenize the image without prior knowledge of the contrast. In the case of MR images of the head, techniques are known for segmenting the MR head images and homogenizing the individual segments.

In MRI, the "Dixon method" is often used to determine fat images. With this method, at least two contrast images are used, with one contrast image with an out-of-phase contrast and one contrast image with an in-phase contrast being scanned. In the case of out-of-phase conditions, the contrast image corresponds to the magnitude of the difference between water intensity ("W") and fat intensity ("F"), i.e. |W−F|. In the case of in-phase conditions, the contrast image corresponds to the magnitude of the sum of the water and fat intensities |W+F|. It is important with the Dixon method for additional assumptions to hold true in order to make definitive conclusions regarding W and F from the change in phase (as discussed in US 2011/0091090 A1).

The methods known at present do not provide a generally satisfactory result.

Even though the Dixon method provides a degree of normalization, it is not necessary for diagnostic reasons to record two contrasts for every examination, but, for example to record only out-of-phase contrasts. In this case, a recording (MR data acquisition) with two contrasts would always be associated with a diagnostically unnecessary loss of time solely to enable the necessary normalization procedures to be performed.

SUMMARY OF THE INVENTION

An object of the present invention is to provide an alternative, more convenient method and computer for normalizing magnetic resonance images, as well as a corresponding data storage medium for controlling a magnetic-resonance imaging apparatus, and a magnetic-resonance imaging apparatus related thereto, with which the above-described disadvantages are avoided.

The invention is in the field of magnetic resonance imaging. The contrast images referred to in the following are images recorded with a magnetic-resonance imaging apparatus, i.e, with the MR data acquisition scanner thereof.

The method according to the invention normalizes contrast images of an examination object, and is particularly suitable for normalizing the B1+ value and the T1 value. The examination object has two chemically different substances thereon, for example water and fat, wherein the first substance produces a first image signal ("W") and the second substance produces a second image signal ("F") or gives rise to such a signal in the contrast image. As used herein, the "second" substance is considered to be that for which the image signal is more homogeneous in the contrast image compared to the other substance. The method includes the following steps.

Provision of a Complex-Valued Contrast Image:

The contrast image reproduces the magnitude, of each pixel therein, of the difference between the respective image signals, i.e. |W−F|, of the two chemical substances (thus the respective contributions of the respective image signals to each pixel). It is important with respect to the contrast image that the recording (data acquisition) is performed with substantially out-of-phase, i.e. anti-parallel, transverse magnetization of the nuclear spins of the respective substances. This kind of scan is, for example, known in the context of gradient-echo sequences and the Dixon method. However, in contrast to the above-described known Dixon method, the method according to the invention does not require an in-phase scan.

Performance of a Phase Correction:

A phase correction of the contrast image is performed in the computer that was provided with the complex-values contrast image, in which a real-valued contrast (W−F) of the first image signal W and the second image signal F is determined for (preferably all) pixels of the contrast image. Different possibilities for such a phase correction are known (see for example Ma J. et al, "Silicone specific imaging using a single-echo Dixon technique", Proc ISMRM 2008, 2723). It is usual to use a method that determines a qualifying symbol '+' or '−' for the amount |W−F|, such that the residual phase is spatially as mathematically smooth as possible.

Determination of a Mathematically Smooth Correction Map:

The correction map is determined based on a number of the pixels with the contrast (W−F). For the purpose of the invention, a mathematically smooth correction map means a field based on a two-dimensional mathematical function that represents a continuously differentiable parameterized curve in both dimensions with a non-disappearing derivative. For example, this can mean that an arbitrary path over the field does not stop at any point or change direction abruptly. The basic assumption is that the image intensity of the second substance is homogeneous, as is the case, for example, with fat or silicone, so it is possible to make conclusions regarding the transmit and receive sensitivities from the inhomogeneity of the corresponding image intensity.

Correction of the Intensity:

The intensity of the pixels of the contrast image is corrected based on the correction map determined in the preceding step. Since it may be assumed that, due to transmit and/or receive characteristics, homogeneities in the image signal act as a multiplication product on the contrast image that was determined. This action thus can take place by multiplication or division of the values of the contrast image and the corresponding values of the correction map. This is driven by the fact that the correction map should be spatially smooth or should not have a spatially dependent structure and therefore it can be determined from a subset of pixels.

Very good results are obtained when fat is selected as the second substance, since pixels (or voxels) with a high fat content in the contrast image are expected to basically have the same image intensity. A particularly good correction map can be compiled if a sufficient number of distributed fat-dominated pixels are present in the contrast image. The physical background is that fat varies only weakly relative to its magnetic resonance signal, because its magnetic resonance relaxation always has a very similar course. In contrast thereto, the course of the relaxation of water, and hence the image contrast produced thereby, often differs depending upon the environment or tissue type. In addition, the proton density of water-containing tissue varies more strongly than that of fat tissue. The correction map can also be applied to further acquisitions.

A computer according to the invention for normalizing contrast images of an examination object comprising two chemically different substances, wherein the first substance has a first image signal W and the second substance has a second image signal F, has the following components.

An interface that receives a complex-valued contrast image, which reproduces the amount of the respective image signals |W−F| of the two chemical substances with substantially out-of-phase transverse magnetization.

A phase-correction processor circuit performs phase correction of the contrast image by calculating a real-valued contrast (W−F) of the first image signal W and the second image signal F from the complex-valued contrast image.

A determining processor circuit that determines a mathematically smooth correction map based on a number of the pixels with the contrast (W−F).

A correction processor circuit that corrects the intensity of the pixels of the contrast image or further scans based on the correction map.

The control computer according to the invention controls a magnetic-resonance imaging apparatus so as to carry the method described herein.

A magnetic resonance imaging apparatus according to the invention has such a control computer according to the invention.

A large part of the aforementioned components of the device or the control facility can be implemented completely or partially in the form of software modules in a processor of a corresponding control computer. An extensively software-based implementation has the advantage that it is also possible to retrofit devices or control facility used to date in a simple way via a software update in order to work in the manner according to the invention. Therefore, the above object is also achieved in accordance with the invention by a non-transitory, computer-readable data storage medium, which can be loaded directly into a computer or a memory of a magnetic resonance apparatus, with program code for carrying out all steps of the method according to the invention when the program code is executed in the computer. The storage medium can optionally have additional parts such as documentation and/or additional components, including hardware components, such as hardware keys (dongles etc.) for using the code.

In a preferred embodiment of the method, a material is selected for the second substance for which the signal intensity in the contrast image is substantially homogeneous, preferably fat or silicone.

In a preferred embodiment of the method, during the formation of the correction map in the computer, first a mask is generated of the pixels with which the first image signal W is smaller, in particular much smaller, than the second image signal F relative to the contrast (W−F). The term "much smaller", i.e. W<<F, in this context means that in the relevant pixel, the image signal F of the second substance predominates to such a degree that the image signal of the first substance can be ignored, for example within the scope of a measuring error or noise. In particular, "much smaller" means that the quotient of the second image signal F divided by the first image signal W, i.e. F/W, is greater than 2, preferably greater than 10, particularly preferably greater than 50. If the contrast (W−F) were plotted in the contrast image, this would be the most negative image points. If it were possible to plot the contrast −(W−F) in the (inverted) contrast image, this would be the most positive image points. In this respect, there can be, for example, a threshold that determines when a pixel can be considered to belong to the mask.

Subsequently, a (spatially) mathematically smooth model field is adapted to the pixels with the contrast (W−F) of the mask. This model field should be defined in the entire area of the correction map. The adaptation can take place, for example, by means of an adaptation calculation ("curve fit"). The model field should be adapted such that it extends as well as possible through all the values determined by the mask. One known measure for this is the so-called confidence level. For example, the function of the Gauss-Newton method could be used for the adaptation. Since MR signals do not have an absolute unit, the correction map determined in this way can be scaled with a global factor. As explained in the next paragraph, to this end it is advantageous to apply scaling to the correction map such that it has, on average, a value of '1' within the mask used.

The correction map enables the image to be homogenized. Herein, depending upon the sequence technique used and the parametrization thereof, the map can be identified with a B1+ variation. Herein, for homogenization, the image signal at a pixel is divided by value of the correction map at this pixel. Herein, within the mask used, the scaling mentioned in the previous paragraph ensures that the image is homogeneous and on average has the same image signal. Outside the mask used, the image is homogenized since transmit and receive inhomogeneities little spatial structure and vary weakly.

A preferred method, which is particularly suitable for T1 determination, i.e. for the determination of the relaxation time, has the additional steps:

Provision of a number of contrast images in accordance with the FLASH method principle (FLASH: "fast low-angle shot"), wherein contrast images are recorded with different flip angles for the excitation pulse. The "FLASH method" is known to those skilled in the art. Herein, multiple repeat recordings of contrast images are taken with FLASH contrast and with a different flip angle for the excitation pulse for each repetition.

Determination of a multiplicative correction map for the flip angle based on pixels with a value T1 determined from the contrast (W−F), so that the multiplicative correction map is mathematically smooth.

It is known how to calculate T1 parameter maps and proton-density maps from scans according to the FLASH-method. It is furthermore known that the T1 maps are heavily dependent upon the homogeneity of the transmit signal (the B1+ field) and that the proton-density maps depend on both the homogeneity of the transmit signal and the receive field (B1− field). The signal formula for FLASH contrast is $$S = \rho \sin(\alpha) \frac{1 - e^{\frac{-TR}{T1}}}{1 - \cos(\alpha)e^{\frac{-TR}{T1}}}, \qquad (1)$$

wherein ρ is the proton density including the receive field, α is the flip angle, TR is the repetition time and T1 is the longitudinal relaxation time. As a rule, α<<1 and TR<<T1. In this case, the following approximation applies $$S \approx \frac{\rho\alpha}{1 + \alpha^2 \frac{T1}{2TR}}. \qquad (2)$$

Since the homogeneity of the transmit signal is proportional to the flip angle α, in the variation of the transmit signal, the fitted T1 is quadratically scaled and the proton density p is linearly scaled.

Preferably, a material is selected for the second substance with a T1 value that is substantially homogeneous in the contrast image. Again, in order to form the correction map, first, a mask (M) is generated of the pixels with which the first image signal W is (much) smaller than the second image signal F relative to the contrast (W−F). In this regard, reference is made to the more detailed explanation above.

In contrast to the aforementioned preferred embodiment, corresponding T1 values are assumed (to be known) for the pixels of the mask, for example for fat, depending upon the magnetic field, a T1 value of 200-300 ms. Hence, it is possible to determine for each pixel within the mask the value of the correction map with which the respective nominal flip angles have to be scaled in order to obtain the prespecified T1 value. Subsequently, a mathematically smooth model field is adapted to the values of the correction map of the pixels of the mask, which is preferably defined in the entire area of the correction map. The correction map obtained can be used to determine the actual flip angle for each pixel, in particular also outside the mask, by multiplication with the nominal flip angle and then to determine a T1 value corrected by transmission inhomogeneities.

In another embodiment of the method, it can be further assumed that the actual flip angle can be calculated by the above-described method for each pixel, and that the proton density is constant within a mask. Similarly to the above described method, it is then possible to determine a spatially weakly varying multiplicative correction map that homogenizes the proton density and can also be used outside the mask. This correction map can be identified with the reception inhomogeneity B1−.

According to another embodiment, a number of contrast images is also provided in accordance with the FLASH method principle, wherein contrast images are recorded with different flip angles for the excitation pulse. For the correction map, the flip angle of a known B1+ map is scaled such that a prespecified T1 value in the form of a mean value is determined within the mask. Subsequently, a mathematically smooth model field is adapted to the values of the correction map of the pixels of the mask and the shape of the scanned B1 field used for extrapolation outside the mask. Herein, the T1 values are preferably determined by a numerical fit to scans with a different flip angle. It would also be possible for the T1 values to be established and the scaling factor of the flip angles to be fitted in the same fit. In an advantageous approximation, the rescaling factor is the root of the fitted T1 values divided by the desired T1 value.

The model field is preferably formed from a polynomial or B-splines, wherein in the context of the adaptation, on the achievement of a prespecified confidence level, the polynomial with the lowest order or the B-splines with the fewest control points are selected. Basically, the order of the polynomial or the number of control points of the B-splines should be as low as possible.

In another version, the shape of the B1 field is known up to a scaling factor from another scan (for example for purposes of adjustment) and the scaling factor is selected such that the T1 values within the mask correspond to the prespecified value as far as possible.

Preferably, water is selected for the first substance (SW).

Preferably, the correction of the intensity of the pixels of the contrast image is also applied to the image signal W of the first substance, to the amount of the image signals |W−F|, to the image signal of a further substance and/or to a further recorded contrast.

A preferred computer is designed such that the determining processor has the following components, which can be individually designed circuits of the determining processor:

A mask-compiling processor designed to generate a mask of those pixels with which the first image signal W is (much) smaller than the second image signal F relative to the contrast W−F.

A model-field-adaptation processor designed to adapt a mathematically smooth model field to the pixels of the mask.

A correction-map-determining processor designed to determine a correction map. The correction map should be mathematically smooth.

DESCRIPTION OF THE PREFERRED EMBODIMENTS

Figure 1:
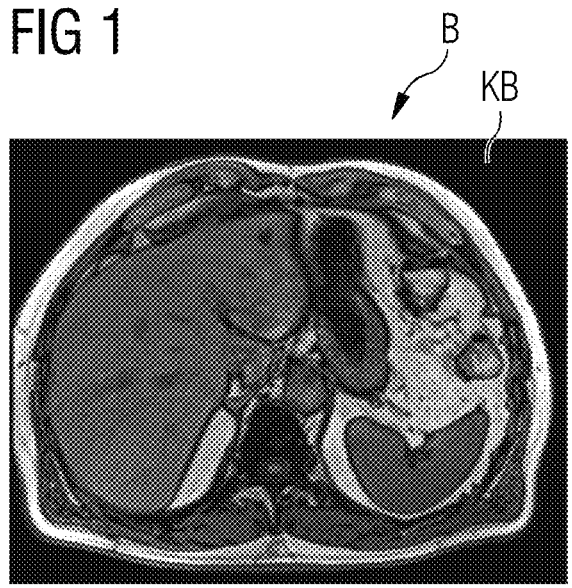
FIG. 1 depicts a contrast image.

FIG. 1 depicts a contrast image KB of the abdominal cavity. Different image signals W, F of two substances SW, SF can be clearly identified, wherein the gray tones, i.e. the values of the pixels of the image correspond to the amount of the respective image signals B, also |W−F|. The lighter a pixel, the higher the amount of the respective image signals B (|W−F|). In this case, the first substance W is water and the second substance F is fat.

Figure 2:
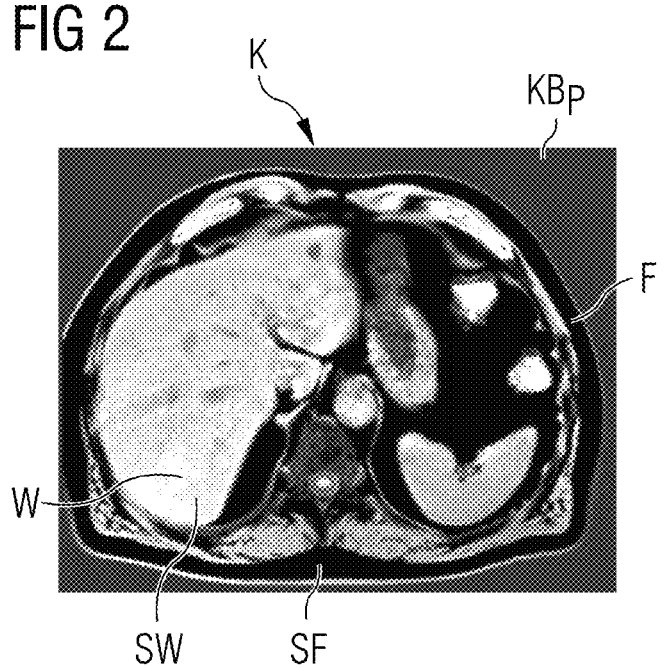
FIG. 2 depicts a phase-corrected contrast image.

FIG. 2 depicts a phase-corrected contrast image $KB_P$ of the contrast image KB in FIG. 1 after a phase correction. Here, the image signals W, F of the two substances SW, SF are no longer present as the amount of the respective image signals B, but are present as the contrast K with (W−F). In this depiction, therefore, the values of the pixels of the image (gray tones) correspond to the difference of the first image signal W minus the second image signal F. The lighter a pixel, the greater the influence of the first image signal W and hence also the quantity of the first substance (here water), the darker a pixel, the greater the influence of the second image signal F and hence also the quantity of the second substance (here fat).

Figure 3:
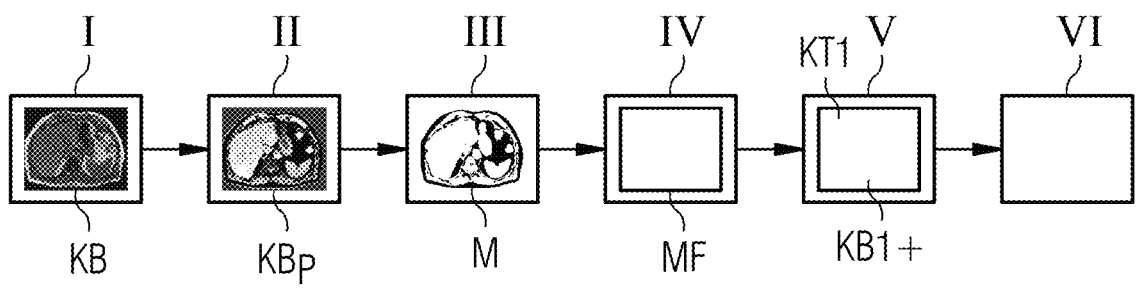
FIG. 3 is a flowchart of an exemplary sequence of the method according to the invention.

FIG. 3 schematically illustrates the method according to the invention for normalizing contrast images KB of an examination object O, for example a body region. For satisfactory results of the method, the examination object O should have two chemically different substances SW, SF. In the contrast image, the first substance SW contributes a first image signal W and the second substance SF contributes a second image signal F, wherein during the recording, the phases of the two image signals are present in the form of a complex superposition and the contrast image KB merely reproduces the real part.

Step I is the provision of a complex-valued contrast image KB, which reproduces the amount of the respective image signals b of the two chemical substances SW, SF with substantially out-of-phase transverse magnetization. This amount of the respective image signals B corresponds to the complex superposition of the phases |W−F|.

Step II is the performance of a phase correction of the contrast image KB by calculating a real-valued contrast (W−F) of the first image signal W and the second image signal F from the image signals B (W−F) for pixels of the contrast image KB. This phase-corrected contrast image $KB_P$ also includes negative values. If, as in FIG. 2, it reproduces the image information of the contrast W−F for water and fat in the form (W−F), the fat-dominated domains are negative and the water-dominated domains are positive. When, as in the form of an inverted FIG. 2, it reproduces the image information of the contrast W−F for water and fat in the form −(W−F) or (F−W), the fat-dominated domains are positive and the water-dominated domains are negative.

Steps III to V is a determination of a mathematically smooth correction map KB1+, KT1 based on a number of the pixels with the contrast K (W−F). One possible correction map KB1+ can permit a correction of the B1+ values, another possible correction map KT1 a correction of the T1 value.

In this example, fat was selected for the second substance SF for which the intensity in the contrast image KB is substantially homogeneous.

Figure 4:
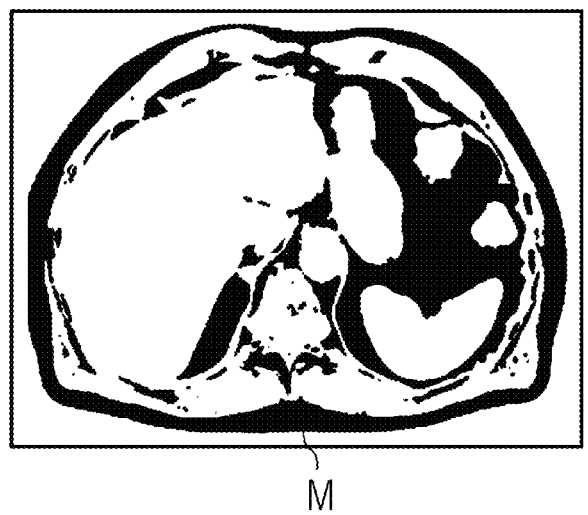
FIG. 4 depicts a mask as used in accordance with the invention.

Step III is the generation of a mask M of the pixels with which the first image signal W is much smaller than the second image signal F relative to the contrast W−F. Since, in this case, the phase-corrected contrast image $KB_P$ represents fat-dominated domains or pixels with negative values (black, see FIG. 2), the values selected for the mask M values lie below a negative limit value. A possible mask is shown in FIG. 4.

Step IV is an adaptation of a mathematically smooth model field FM to the pixels with the contrast K (i.e. W−F) of the mask M. This field is preferably defined in the entire area of the correction map KB1+ thus making the creation of the correction map KB1+ simpler. If a correction map KT1 is to be created for the relaxation T1, pixels of the mask must have a T1 value (additionally to the (W−F) value or instead of the (W−F) value).

Step V is a determination of the correction map KB1+ for B1+ values or a determination of the correction map KT1 for T1 values. This is determined such that, upon correction of the model field FM by use of the correction map KB1+, KT1, the result is an area that is as homogeneous as possible.

Step VI is a correction of the intensity of the pixels of the contrast image KB based on the correction map KB1+, KT1. For example, depending upon the manner of compilation of the correction map KB1+, KT1, the pixels of the contrast image KB can be added to the map values, subtracted from these values, multiplied therewith or divided thereby.

FIG. 4 shows a depiction of a possible mask formed from a phase-corrected contrast image KBP as depicted in FIG. 2. The mask is formed, as explained in more detail in step III.

Figure 5:
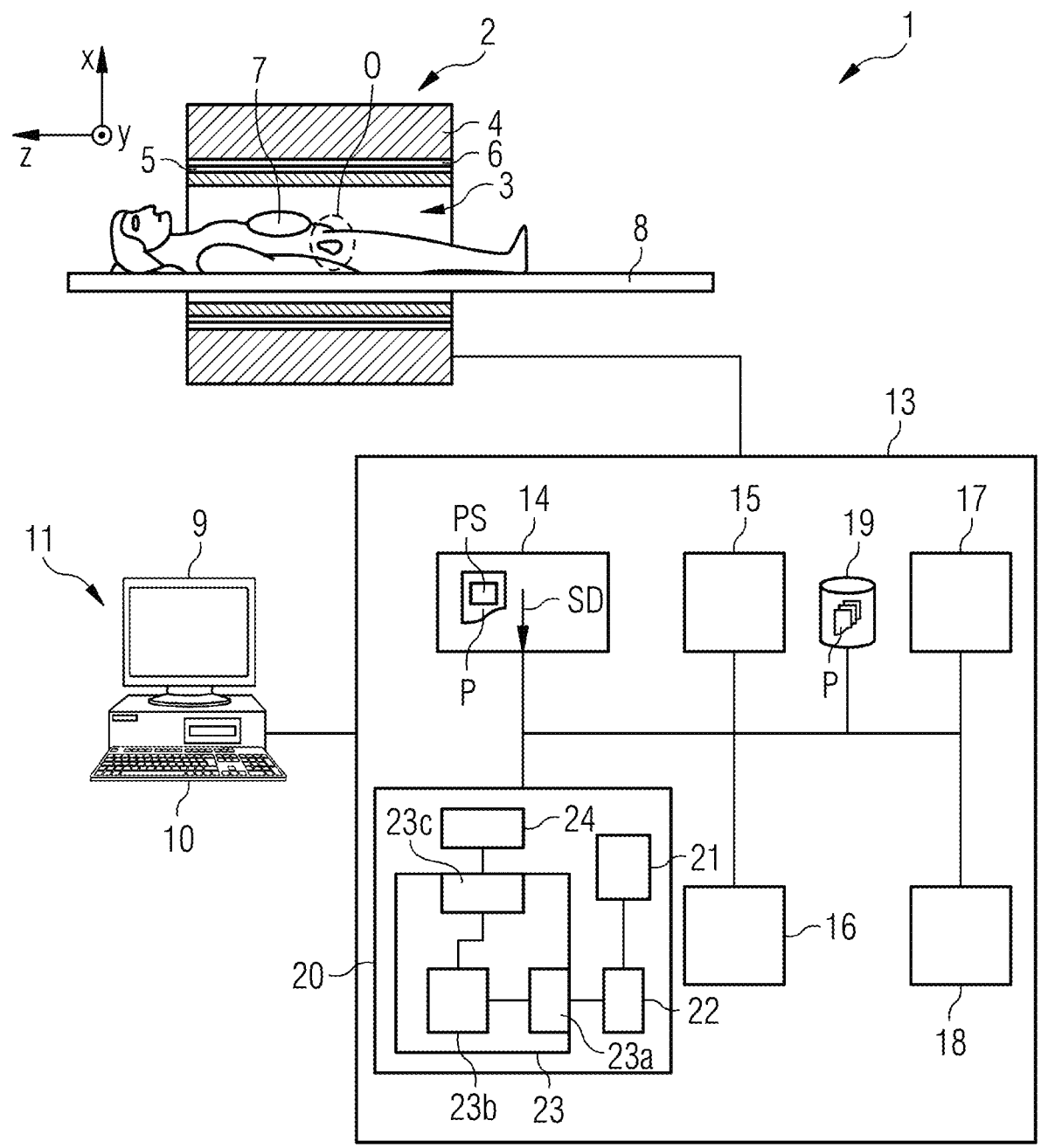
FIG. 5 schematically illustrates a magnetic-resonance imaging apparatus according to an exemplary embodiment of the invention.

In FIG. 5 is a schematic depiction of a magnetic-resonance imaging apparatus 1. It includes the actual magnetic-resonance scanner 2 with an examination chamber 3 or patient tunnel. A patient or test subject in which the actual examination object O is located, or in which a specific body region represents the examination object O, is positioned on a bed 8 in the chamber 3.

The magnetic-resonance scanner 2 is equipped with a basic field magnet 4, a gradient coil system 6 and an RF transmit antenna system 5, and an RF reception antenna system 7. In the exemplary embodiment depicted, the RF transmit antenna system 5 is a whole-body coil permanently installed in the magnetic-resonance scanner 2, whereas the RF reception antenna system 7 includes local coils arranged on the patient or test subject (in FIG. 5, this is only symbolized by one local coil). In principle, it is also possible for the whole body coil to be used as an RF reception antenna system and the local coils as an RF transmit antenna system, as long as these coils can in each case be switched to different operating modes. The basic field magnet 4 generates a basic magnetic field in the longitudinal direction, i.e. along the longitudinal axis of the magnetic resonance scanner 2 extending in the z direction. The gradient coil system 6 typically has individually controllable gradient coils in order to be able to switch (activate) gradients in the x, y and z directions independently of one another. The magnetic-resonance scanner 2 can also contain shim coils (not shown) embodied in the conventional way.

The magnetic resonance imaging apparatus 1 depicted in FIG. 5 is a whole body system with a patient receptacle into which the entirety of the patient can be introduced. In principle the invention can also be used in other magnetic resonance imaging systems, for example with a laterally open, C-shaped housing. The only essential factor is that it is possible to prepare corresponding recordings of the examination object O.

The magnetic resonance imaging apparatus 1 furthermore has a central control computer 13 that controls the MR apparatus 1. This central control computer 13 includes a sequence controller 14. The sequence controller controls the sequence of radio-frequency pulses (RF pulses) and gradient pulses in dependence on a selected pulse sequence PS or a series of a number of pulse sequences for acquiring MR data from a number of slices in volume region of interest of the examination object O, within one scanning session. Such a pulse sequence PS can be specified and parameterized within a scan or control protocol P. Typically, different control protocols P for different scans or scan sessions are stored in a memory 19, and can be selected by an operator (and optionally changed if necessary) and then used to carry out the scan. In the present case, the control computer 13 contains pulse sequences for the acquisition of the raw data.

To emit the individual RF pulses of a pulse sequence PS, the central control computer 13 has a radio-frequency transmit circuit 15 that generates and amplifies the RF pulses and feeds them into the RF transmit antenna system 5 and via a suitable interface (not depicted in detail). To control the gradient coils of the gradient coil system 6 in order to switch the gradient pulses suitably in accordance with the prespecified pulse sequence PS, the control computer 13 has a gradient system interface 16. The sequence controller 14 communicates with the radio-frequency transmit circuit 15 and the gradient system interface 16 in a suitable way, for example by emitting sequence control data SD, in order to execute the pulse sequence PS.

The control computer 13 also has a radio-frequency reception circuit 17 (which likewise communicates in a suitable manner with the sequence controller 14) in order to receive magnetic resonance signals within a readout window specified by the pulse sequence PS, coordinated with the RF reception antennal system 7, and thus to acquire the raw MR data.

A reconstruction processor 18 accepts the acquired raw MR data and reconstructs magnetic-resonance image data therefrom (in an image data file). This reconstruction is also performed on the basis of parameters that are specified in the respective scan or control protocol P. The image data can then be stored in a memory 19 and/or presented as an image at a display screen.

The details of how raw MR data are acquired by the radiation of RF pulses and the switching of gradient pulses, and how MR images or contrast images KB reconstructed therefrom, are in principle known to those skilled in the art, and therefore need not explained in further detail herein.

The preferred computer 20 for normalizing contrast images KB is in data contact with the other units, in particular the gradient system interface 16 or the sequence controller 14. Alternatively, it can also be part of the sequence controller 14. The computer 20 has a number of circuits to determine or ascertain different variables.

One of these circuits is an interface 21 for receiving the contrast image KB.

A further circuit is a phase-correction processor circuit 22 for performing a phase correction of the contrast image KB by calculating a real-valued contrast (W−F) of the first image signal W and the second image signal F from the complex-valued image signals B (|W−F|) for pixels of the contrast image KB.

A further circuit is a determining processor circuit 23 for determining a mathematically smooth correction map KB1+, KT1 based on a number of the pixels with the contrast K with the value W−F.

This determining processor circuit 23 has here three further components.

One of these components is a mask-compiling circuit 23a designed to generate a mask M of the pixels with which the first image signal W is (much) smaller than the second image signal F relative to the contrast W−F.

A further component is a model-field-adaptation circuit 23b designed to adapt a mathematically smooth model field FM to the pixels of the mask M.

The third component is a correction-map-determining circuit 23c designed to determine a correction map KB1+, KT1 such that, on correction of the model field FM by the correction map KB1+, KT1, the result is an area that is as homogeneous as possible.

A further circuit is a correction circuit 24 for correcting the intensity of the pixels of the contrast image KB based on the correction map KB1+, KT1.

The central control computer 13 can be operated via a terminal 11 with an input interface 10 and an output interface 9 via which it is hence possible for the entire magnetic resonance imaging apparatus 1 to be operated by one operator. It is also possible for magnetic resonance images to be displayed on a display screen of the output interface 9 and the input interface 10 can be used, possibly in combination with the display screen, to plan and start scans and in particular to select and modify control protocols P.

The magnetic resonance imaging apparatus 1 according to the invention and in particular the control computer 13 can also have a number of further components, which, although not depicted individually here, are typically present in such systems, such as, for example a network interface in order to connect the entire system to a network and raw data and/or to enable the exchange of image data or parameter maps, and also further data, such as patient-relevant data or control protocols.

The way in which the radiation of RF pulses and the generation of gradient fields enables suitable raw data to be acquired in the form of an out-of-phase recording and contrast images KB reconstructed therefrom is known in principle to those skilled in the art, and thus need not be explained in further detail herein.

It should be once again noted that the method described in detail above and the magnetic-resonance imaging apparatus 1 are exemplary embodiments only, which can be modified by those skilled in the art without departing from the scope of the invention. The use of the indefinite article "a" or "an" does not preclude the possibility that the features in question may also be present on a multiple basis. Similarly, the terms "unit" and "module" do not preclude the possibility that the components in question are formed by multiple interacting components, which may be spatially distributed.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for normalizing complex-valued magnetic resonance (MR) complex-valued contrast images of an examination object, said examination object comprising first and second chemically different substances, wherein nuclear spins of said first substance produce a first image signal in an MR data acquisition sequence executed in an MR data acquisition scanner, and wherein said second substance produces a second MR image signal in said MR data acquisition sequence, said method comprising:

providing said complex-valued MR contrast images to a processor, with each complex-valued contrast image comprising pixels having respective intensities that result from respective contributions made by said first and second MR image signals when the respective nuclear spins of said first and second substances are given out-of-phase transverse magnetizations in said MR data acquisition sequence;

in said processor, performing a phase correction of one of said complex-valued MR contrast images, by calculating a real-valued contrast of said first MR image signal and said second MR image signal from the respective contributions of the first and second image signals in the pixels of the one of said complex-valued MR contrast images;

in said processor, determining a mathematically smooth correction map based on a number of pixels having a predefined value of said real-valued contrast; and homogenizing the respective intensities of the pixels of the complex-valued contrast images provided to said processor, using said correction map, thereby producing homogenized MR contrast images, and making the homogenized MR contrast images available from the processor in electronic form as at least one data file.

2. A method as claimed in claim 1 comprising providing said complex-valued MR contrast images to said processor wherein said second substance is substantially homogenous.

3. A method as claimed in claim 1 wherein said second substance is selected from the group consisting of fat and silicone.

4. A method as claimed in claim 1 comprising forming said correction map by:
first generating a mask of pixels for which said first image signal is smaller than said second image signal with regard to said real-valued contrast;
adapting a mathematically smooth model field to the pixels of the mask, said mathematically smooth model field being defined for an entire area of said correction map; and
determining said correction map for B1+ values so that, upon correction of said mathematically smooth model field with said correction map, a substantially homogenous mathematically smooth model field results.

5. A method as claimed in claim 4 comprising:
providing said plurality of complex-valued MR contrast images to said processor, as complex-valued MR images that were acquired using a FLASH sequence as said MR data acquisition sequence, with the respective complex-valued MR contrast images being acquired with different flip angles of an excitation pulse in said flash sequence;
in said processor, determining a correction map for respective pixels within said mask that determines the respective flip angle for each pixel by multiplication with a nominal flip angle, with a predetermined T1 value being obtained by that respective flip angle;
using the correction map outside of said mask to determine an actual flip angle at each respective pixel in the T1 calculation; and
in said processor, determining a multiplicative correction map wherein a proton density is determined within said mask so as to be homogenous, for use outside of said mask.

6. A method as claimed in claim 4 comprising:
providing said plurality of complex-valued MR contrast images to said processor, as complex-valued MR images that were acquired using a FLASH sequence as said MR data acquisition sequence, with the respective complex-valued MR contrast images being acquired with different flip angles of an excitation pulse in said flash sequence;
in said processor, determining said correction map by scaling the respective flip angle of a known B1+ map in order to determine a predetermined T1 value as an average value within said mask; and
adapting the mathematically smooth model field to values of said correction map for pixels of said mask, with a shape of a B1 field in said flash sequence being used to extrapolate values outside of said mask.

7. A method as claimed in claim 4 comprising forming said mathematically smooth model field from a polynomial or from B-splines so that, in the adapting, a polynomial with a lowest order or B-splines with fewest control points, are selected based on a predetermined confidence level definition.

8. A method as claimed in claim 1 wherein said first substance is water.

9. A method as claimed in claim 1 comprising determining said correction map as a correction map for B1+ values and a correction map for T1 values, and, in said processor, determining B1− from said correction maps.

10. A method as claimed in claim 1 comprising also correcting respective intensities of pixels in said complex-valued MR image for said first substance, or to an image signal from a further substance or to a further contrast.

11. A computer for normalizing complex-valued magnetic resonance (MR) complex-valued contrast images of an examination object, said examination object comprising first and second chemically different substances, wherein nuclear spins of said first substance produce a first image signal in an MR data acquisition sequence executed in an MR data acquisition scanner, and wherein said second substance produces a second MR image signal in said MR data acquisition sequence, said computer comprising:
a processor;
an input that provides said complex-valued MR contrast images to said processor, with each complex-valued contrast image comprising pixels having respective intensities that result from respective contributions made by said first and second MR image signals when the respective nuclear spins of said first and second substances are given out-of-phase transverse magnetizations in said MR data acquisition sequence;
said processor being configured to perform a phase correction of one of said complex-valued MR contrast images, by calculating a real-valued contrast of said first MR image signal and said second MR image signal from the respective contributions of the first and second image signals in the pixels of the one of said complex-valued MR contrast images;
said processor being configured to determine a mathematically smooth correction map based on a number of pixels having a predefined value of said real-valued contrast; and
said processor being configured to homogenize the respective intensities of the pixels of the complex-valued contrast images provided to said processor, using said correction map, thereby producing homogenized MR contrast images, and to make the homogenized MR contrast images available from the processor in electronic form as at least one data file.

12. A computer as claimed in claim 11 wherein said processor is configured to:
first generate a mask of pixels for which said first image signal is smaller than said second image signal with regard to said real-valued contrast;
adapt a mathematically smooth model field to the pixels of the mask, said mathematically smooth model field being defined for an entire area of said correction map; and
determine said correction map for B1+ values so that, upon correction of said mathematically smooth model field with said correction map, a substantially homogenous mathematically smooth model field results.

13. A method as claimed in claim 11 wherein:
said input provides said plurality of complex-valued MR contrast images to said processor, as complex-valued MR images that were acquired using a FLASH sequence as said MR data acquisition sequence, with the respective complex-valued MR contrast images being acquired with different flip angles of an excitation pulse in said flash sequence;
said processor is configured to determine a correction map for respective pixels within said mask that determines the respective flip angle for each pixel by multiplication with a nominal flip angle, with a predetermined T1 value being obtained by that respective flip angle;
said processor is configured to use the correction map outside of said mask to determine an actual flip angle at each respective pixel in the T1 calculation; and said processor is configured to determine a multiplicative correction map wherein a proton density is determined within said mask so as to be homogenous, for use outside of said mask.

14. A magnetic resonance (MR) apparatus for normalizing complex-valued magnetic resonance (MR) complex-valued contrast images of an examination object, said examination object comprising first and second chemically different substances, said MR apparatus comprising:

an MR data acquisition scanner that executes an MR data acquisition sequence wherein nuclear spins of said first substance produce a first image signal in said MR data acquisition sequence, and wherein said second substance produces a second MR image signal in said MR data acquisition sequence;

a processor provided with said complex-valued MR contrast images, with each complex-valued contrast image comprising pixels having respective intensities that result from respective contributions made by said first and second MR image signals when the respective nuclear spins of said first and second substances are given out-of-phase transverse magnetizations in said MR data acquisition sequence;

said processor being configured to perform a phase correction of one of said complex-valued MR contrast images, by calculating a real-valued contrast of said first MR image signal and said second MR image signal from the respective contributions of the first and second image signals in the pixels of the one of said complex-valued MR contrast images;

said processor being configured to determine a mathematically smooth correction map based on a number of pixels having a predefined value of said real-valued contrast; and said processor being configured to homogenize the respective intensities of the pixels of the complex-valued contrast images provided to said processor, using said correction map, thereby producing homogenized MR contrast images, and to make the homogenized MR contrast images available from the processor in electronic form as at least one data file.

15. A non-transitory, computer-readable data storage medium encoded with programming instructions for normalizing complex-valued magnetic resonance (MR) complex-valued contrast images of an examination object, said examination object comprising first and second chemically different substances, wherein nuclear spins of said first substance produce a first image signal in an MR data acquisition sequence executed in an MR data acquisition scanner, and wherein said second substance produces a second MR image signal in said MR data acquisition sequence, said data storage medium being loaded into a processor and said programming instructions causing said processor to:

receive said complex-valued MR contrast images, with each complex-valued contrast image comprising pixels having respective intensities that result from respective contributions made by said first and second MR image signals when the respective nuclear spins of said first and second substances are given out-of-phase transverse magnetizations in said MR data acquisition sequence;

perform a phase correction of one of said complex-valued MR contrast images, by calculating a real-valued contrast of said first MR image signal and said second MR image signal from the respective contributions of the first and second image signals in the pixels of the one of said complex-valued MR contrast images;

determine a mathematically smooth correction map based on a number of pixels having a predefined value of said real-valued contrast; and homogenize the respective intensities of the pixels of the complex-valued contrast images provided to said processor, using said correction map, thereby producing homogenized MR contrast images, and make the homogenized MR contrast images available from the processor in electronic form as at least one data file.

\* \* \* \* \*